(12) United States Patent
Colombo et al.

(10) Patent No.: US 7,528,024 B2
(45) Date of Patent: May 5, 2009

(54) DUAL WORK FUNCTION METAL GATE INTEGRATION IN SEMICONDUCTOR DEVICES

(75) Inventors: Luigi Colombo, Dallas, TX (US); James J. Chambers, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 303 days.

(21) Appl. No.: 10/890,365

(22) Filed: Jul. 13, 2004

(65) Prior Publication Data

US 2005/0258468 A1 Nov. 24, 2005

Related U.S. Application Data

(63) Continuation-in-part of application No. 10/852,523, filed on May 24, 2004, now Pat. No. 7,098,516.

(51) Int. Cl.
*H01L 21/28* (2006.01)
*H01L 21/338* (2006.01)
*H01L 21/44* (2006.01)

(52) U.S. Cl. .................. 438/176; 438/573; 438/588; 438/659; 438/660

(58) Field of Classification Search .............. 438/573, 438/588, 655, 659, 660, 176, 199; 257/E21.438, 257/E21.47
See application file for complete search history.

(56) References Cited

U.S. PATENT DOCUMENTS

| | | | | |
|---|---|---|---|---|
| 4,877,753 A | * | 10/1989 | Freeman | 438/488 |
| 5,853,960 A | * | 12/1998 | Tran et al. | 430/321 |
| 6,121,124 A | * | 9/2000 | Liu | 438/587 |
| 6,583,012 B1 | * | 6/2003 | Buynoski et al. | 438/275 |
| 6,642,094 B2 | | 11/2003 | Rotondaro et al. | |
| 6,764,810 B2 | * | 7/2004 | Ma et al. | 430/313 |
| 6,881,631 B2 | * | 4/2005 | Saito et al. | 438/283 |
| 6,987,061 B2 | * | 1/2006 | Mehrotra | 438/682 |

(Continued)

OTHER PUBLICATIONS

Yu et al; "Thermally Robust High Quality HfN/HfO2 Gate Stack for Advanced CMOS Devices"; IEEE; 2003.

(Continued)

*Primary Examiner*—Walter L Lindsay, Jr.
*Assistant Examiner*—Ron E Pompey
(74) *Attorney, Agent, or Firm*—Wade J. Brady, III; Frederick J. Telecky, Jr.

(57) ABSTRACT

The present invention provides, in one embodiment, a process for forming a dual work function metal gate semiconductor device (100). The process includes providing a semiconductor substrate (105) having a gate dielectric layer (110) thereon and a metal layer (205) on the gate dielectric layer. A work function of the metal layer is matched to a conduction band or a valence band of the semiconductor substrate. The process also includes forming a conductive barrier layer (210) on a portion (215) of the metal layer and a material layer (305) on the metal layer. The metal layer and the material layer are annealed to form a metal alloy layer (405) to thereby match a work function of the metal alloy layer to another of the conduction band or the valence band of the substrate. Other embodiments of the invention include a dual work function metal gate semiconductor device (900) and an integrated circuit (1000).

15 Claims, 5 Drawing Sheets

U.S. PATENT DOCUMENTS

| | | | |
|---|---|---|---|
| 7,005,365 B2 * | 2/2006 | Chambers | 438/585 |
| 7,017,654 B2 * | 3/2006 | Kenny et al. | 165/80.4 |
| 7,018,887 B1 * | 3/2006 | Pan | 438/225 |
| 2002/0145166 A1 * | 10/2002 | Kachelmeier | 257/368 |
| 2004/0084734 A1 * | 5/2004 | Matsuo | 257/407 |
| 2004/0099916 A1 * | 5/2004 | Rotondaro et al. | 257/412 |
| 2004/0238859 A1 * | 12/2004 | Polishchuk et al. | 257/274 |
| 2004/0245578 A1 * | 12/2004 | Park et al. | 257/369 |

OTHER PUBLICATIONS

Park et al; "Thermally Robust Dual-Work Function ALD-MNx MOSFETs Using Conventional CMOS Process Flow"; 2004 Symposium on VLSI Technology Digest of Technical Papers; IEEE; 2004; pp. 186 & 187.

Lee et al; "Tunable Work Function Dual Metal Gate Technology for Bulk and Non-Bulk CMOS"; IEEE, 2002; pp. 359-362-IEDM.

* cited by examiner

for designing or modifying other

DUAL WORK FUNCTION METAL GATE INTEGRATION IN SEMICONDUCTOR DEVICES

This application is a continuation-in-part of U.S. application Ser. No. 10/852,523, entitled, "REFRACTORY METAL-BASED ELECTRODES FOR WORK FUNCTION SETTING IN SEMICONDUCTOR DEVICES," filed on May 24, 2004 now U.S. Pat. No. 7,098,516 and which is commonly assigned with the present invention, and incorporated by reference as if reproduced herein in its entirety.

TECHNICAL FIELD OF THE INVENTION

The present invention is directed in general to semiconductor devices and the manufacture of semiconductor devices and, more specifically, to manufacturing metal gate structures for semiconductor devices.

BACKGROUND OF THE INVENTION

The ability to dope polysilicon gates to different degrees allows one to adjust the work function of gate electrode materials to particular types of metal oxide silicon (MOS) transistors. It is desirable to adjust the work function of a gate electrode (hereinafter, the gate), to be close to either the conduction band or the valence band of silicon, because this reduces the threshold voltage ($V_t$) of the transistor, thereby facilitating a high drive current at low operating voltages. For instance, dual work function gates, for example doped polysilicon are advantageously used in semiconductor devices, such as complementary metal oxide silicon (CMOS) transistor device, having both pMOS and nMOS transistors. The use of doped polysilicon gates becomes problematic, however, as the dimensions of gates and gate insulators are reduced.

Polysilicon gates can accommodate only a finite amount of dopants. This limitation can result in a depletion of gate charge carriers at the interface between the gate and gate dielectric, when the gate is biased to invert the channel. Consequently, the electrical thickness of the gate stack is substantially increased, thereby deteriorating the performance characteristics of the transistor, such as reducing the drive current and slowing switching speeds. For instance, the effective electrical thickness of a gate dielectric in some pMOS transistors can increase from about 1.0 nanometer during accumulation mode, to about 1.8 nanometers during inversion mode. Depletion of the polysilicon gate is a fundamental issue that limits further scaling of MOS devices.

In addition, when high-k gate dielectrics are used with polysilicon a $V_t$ offset of up to 700 mV is observed for pMOS devices. This large $V_t$ offset is associated with dopant (e.g., boron) diffusion and interaction with the gate dielectric. At present, there is no effective way to control this $V_t$ offset problem.

Metal gates are an attractive alternative to polysilicon because they have a larger supply of charge carriers than doped polysilicon gates. When a metal gate is biased to invert the channel, there is no substantial depletion of carriers at the interface between the metal gate and gate dielectric. Accordingly, the transistor's performance is not deteriorated because the electrical thickness of the gate stack is not increased. The manufacture of semiconductor devices having independently adjustable dual work function metal gates has been troublesome, however.

Ideally, dual work function metal gates should be compatible with conventional gate dielectric materials and have suitably adjustable and stable work functions. It is challenging, however, to find such metals. For instance, there have been attempts to use fully nickel silicided polysilicon as the gate for MOS transistors, with implanted dopants used to adjust the work function. During the annealing process to fully silicide the gate, however, the implanted dopants can interact with the gate dielectric. This can result in the same type of $V_t$ offset problem encountered for doped polysilicon. There is also the potential for nickel atoms to migrate into the gate dielectric and channel, thereby introducing defects that can degrade the performance, reliability, and stability of the device over time.

Others have attempted to use a hafnium nitride gate on a hafnium oxide gate dielectric. Such a gate has a mid-gap work function, meaning that the work function is about mid-way between the valence band and the conduction band of the substrate. Such mid-gap materials are unsatisfactory in a CMOS device, or other settings, where it is desirable to adjust the work function, in order to achieve a low $V_t$.

Accordingly, what is needed in the art is a method of manufacturing semiconductor devices having adjustable and stable metal gates.

SUMMARY OF THE INVENTION

To address the above-discussed deficiencies of the prior art, one embodiment is directed to a process for forming a dual work function metal gate semiconductor device. The process comprises providing a semiconductor substrate having a gate dielectric layer thereon and a metal layer on the gate dielectric layer. A work function of the metal layer is matched to a conduction band or a valence band of the semiconductor substrate. A conductive barrier layer is formed on a portion of the metal layer, and a material layer is formed on the conductive barrier layer and the metal layer. The metal layer and the material layer are annealed to form a metal alloy layer. A work function of the metal alloy layer is matched to another of the conduction band or the valence band of the semiconductor substrate.

Another embodiment is directed to a dual work function metal gate semiconductor device. The device includes a gate dielectric layer located over a semiconductor substrate having a conduction band and a valence band. The device also includes a first gate located over the gate dielectric layer, the first gate including a metal layer located over said gate dielectric layer and a conductive barrier layer located over the metal layer. The metal layer has a work function matched to the conduction band or the valence band. The device further includes a second gate located over the gate dielectric layer. The second gate includes a metal alloy layer having a same metal element as the metal layer. The metal alloy layer has a work function matched to another of the conduction band or the valence band.

Still another embodiment is directed to an integrated circuit. The integrated circuit comprises the above described dual work function metal gate semiconductor device. The integrated circuit also includes interconnect metal lines on one or more insulating layers located over the first and second gate, and interconnecting the first and second gates to form an operative integrated circuit.

The foregoing has outlined preferred and alternative features of the present invention so that those of ordinary skill in the art may better understand the detailed description of the invention that follows. Additional features of the invention described hereinafter can also form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention overcomes previous difficulties in the production of devices having dual work function metal gates by providing a first gate that includes a metal layer whose work function is matched to one of a conduction band or a valence band of a semiconductor substrate. A second gate includes a metal alloy layer whose work function is matched to the other of the conduction band or the valence band. Such dual gate configurations facilitate work function control of the gates to enable dual gate semiconductor devices to be constructed with lower voltage thresholds and higher reliability than hitherto obtainable.

While not limiting the scope of the present invention by theory, it is believed that the absence of dopants in the metal layer in the first gate avoids the accumulation of dopants at the interface between the gate and the gate dielectric. This, in turn, avoids the larger than desired threshold voltages encountered in previous dual metal gate devices, in particular when the gate dielectric is a high k dielectric material.

The term, work function, is defined as the minimum energy required to bring an electron from the Fermi level to the vacuum level. For the purposes of the present invention, a gate's work function is matched to one of a conduction band or a valence band of a semiconductor substrate when the work function is within about 0.4 eV, and more preferably about 0.2 eV, of the energy level of the substrate's conduction band or valence band. As an example, a gate's work function is matched to a silicon substrate's valence band when the gate work function is greater than about 4.8 eV, and more preferably between about 4.9 and about 5.2 eV. Alternatively a gate's work function is matched to a silicon substrate's conduction band when the gate work function is less than about 4.6 eV and more preferably, between about 4.0 and about 4.3 eV.

Of course, the energy levels corresponding to the valence and conduction bands differ depending on the type of material used for the semiconductor substrate and the type and concentration of any dopants in the substrate. One skilled in the art would understand how to determine specific energy level values for the semiconductor substrate of interest and define gate work functions that would match the valence or conduction bands, as appropriate.

Figure 1:
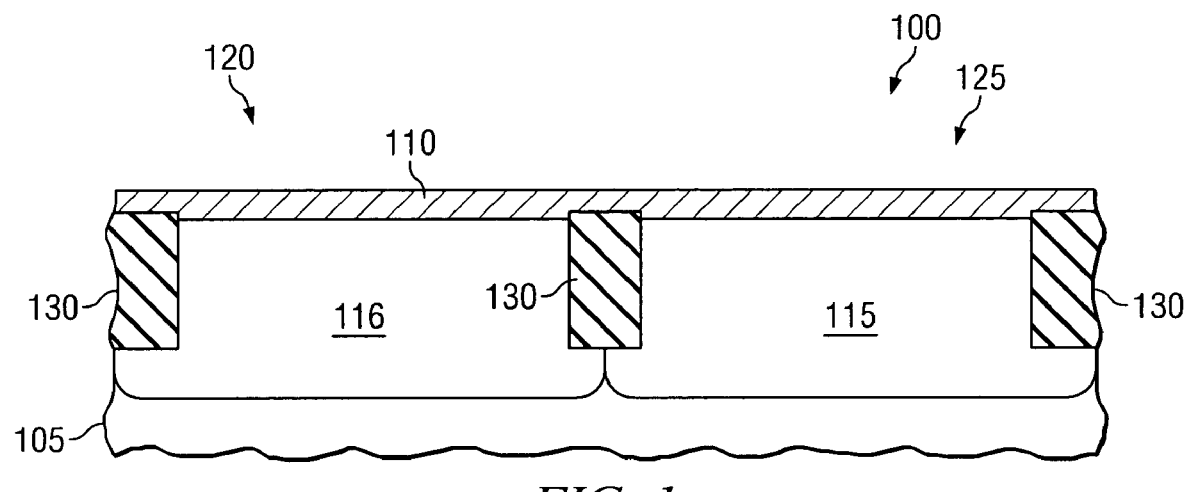
FIGS. 1 to 8 illustrate cross-sectional views of selected steps in processes for forming a dual work function metal gate semiconductor device according to the principles of the present invention

One embodiment of the present invention is illustrated in FIGS. 1-8, a process for forming a dual work function metal gate semiconductor device 100. Turning first to FIG. 1, illustrated is the partially completed device 100 after providing a semiconductor substrate 105 having a conduction band and a valence band, and forming a gate dielectric layer 110 located over, and preferably on, the semiconductor substrate 105.

In some advantageous embodiments, the semiconductor substrate 105 is made of silicon, although other conventional substrate materials, such as silicon-on-insulator, gallium arsenide, germanium, and silicon-germanium substrates, are also within the scope of the invention. For instance, the semiconductor substrate 105 can be a layer located in the partially completed device 100, including a silicon wafer itself or a layer located above the wafer as an epitaxial layer, silicon layer of a silicon-on-insulator (SOI) substrate, or other substrate. The semiconductor substrate 105 can be p-type or n-type and, as illustrated in FIG. 1, further include an n-type doped well 115 and p-type doped well 116 in the substrate 105. Of course, the opposite configuration of an n-type doped well 116 and p-type doped wells 115 is also within the scope of the present invention. As well understood by those skilled in the art, regardless of the type of material and doping used, the semiconductor substrate 105 has a conduction band and a valence band.

As further illustrated in FIG. 1, the device 100 includes two regions: a first transistor region 120 and a second transistor region 125. The first transistor region 120 can be one of a pMOS or nMOS transistor, while the second transistor region 125 is the other of the pMOS or nMOS transistor. As well understood by those skilled in the art, for nMOS transistors, the well is p-type doped, while for pMOS transistors, the well is n-type-doped. In certain configurations, the dual work function metal gate semiconductor device 100 is a CMOS device. The first and second transistor regions 120, 125 are preferably separated by conventional isolation structures 130 such as shallow trench or LOCOS structures. Although the second transistor region 125, comprising a pMOS transistor, is depicted in FIG. 1 as including the well 115, the opposite configuration, or other configurations well known to those skilled in the art, are also within the scope of the present invention.

Any conventional technique can be used to form the gate dielectric layer 110, including atomic layer deposition (ALD), physical vapor deposition (PVD), chemical vapor deposition (CVD), and spin coating, or other procedures well known to those skilled in the art. In some embodiments, the gate dielectric layer 110 includes a refractory metal. For the purposes of the present invention, a refractory metal is defined as any element in Groups 4-6 and Periods 4-6 of the Periodic Table of Elements, as well as elements in the Lanthanide and Actinide series (International Union of Pure and Applied Chemist Convention for designating Groups and Periods). In certain preferred embodiments, the gate dielectric layer 110 is a high-k dielectric material, that is, a material having a dielectric constant of greater than about 4, and more preferably between about 6 and about 20. Non-limiting examples include silicon dioxide, silicon oxynitride, hafnium oxide, hafnium oxynitride, hafnium silicon oxynitride, zirconium oxide, zirconium oxynitride, zirconium silicon oxynitride, titanium oxide, titanium oxynitride, and titanium silicon oxynitride, or other materials well known to those skilled in the art are also within the scope of the present invention.

Figure 2:
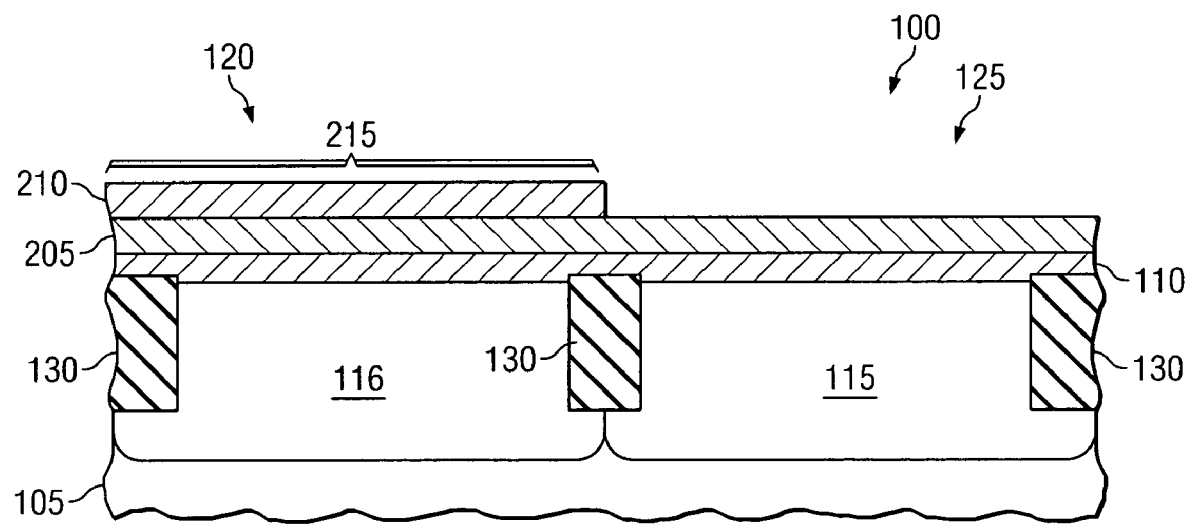

Turning now to FIG. 2, depicted is the partially completed device 100 after forming a metal layer 205 over, and preferably on, the dielectric layer 110. The metal layer 205 can be formed using any number of conventional processes. For instance, the metal layer 205 can be deposited using physical vapor deposition (PVD) such as sputtering, atomic layer deposition (ALD), chemical vapor deposition (CVD), or other deposition techniques. In certain preferred embodiments the metal layer 205 is composed of a refractory metal, and more preferably the same refractory metal as in the gate dielectric layer 110.

Importantly, the metal layer 205 is selected to have a work function that is matched to the conduction band or the valence band of the semiconductor substrate 105. For instance, the metal layer's 205 work function can be matched to a silicon substrate's 105 valence band by making the metal layer 205 out of elements such as molybdenum, tungsten or combinations thereof. Alternatively, the metal layer's 205 work function can be matched to a silicon substrate's 105 conduction band by making the metal layer 205 out of elements such as tantalum, titanium, hafnium, zirconium or combinations thereof.

As further illustrated in FIG. 2, a conductive barrier layer 210 is formed over, and preferably on, a portion 215 of the metal layer 205 using conventional procedures similar to those used to form the dielectric layer 110 or metal layer 205. As illustrated in FIG. 2, the conductive barrier layer 210 is over that portion 215 of the metal layer comprising the transistor region 120. Of course in other embodiments, the conductive barrier layer 210 can be formed over the portion of the metal layer 205 comprising the transistor region 125. One skilled in the art would be familiar with any number of conventional procedures to form the conductive barrier layer 210 over a portion 215 of the metal layer 205. For instance, the conductive barrier layer 210 over the metal layer portion 215 can be covered with a protective mask while the uncovered conductive barrier layer is removed. Removal can be accomplished by conventional etching procedures such as a dry or wet etch, after which the mask is removed.

Preferably, the conductive barrier layer 210 is composed of a material that deters the diffusion of dopants and other elements from an overlying material layer, discussed below, into the metal layer 205. For instance, the conductive barrier layer 210 can thermally decouple and prevent reactions between the metal layer 205 and material layer that can occur at elevated temperatures (e.g., greater than about 700° C.) associated with depositing the material layer. Suitable conductive barrier materials include metal nitride, metal carbide or metal boride. Examples include tungsten nitride, tantalum nitride or titanium nitride.

It is also desirable for the conductive barrier layer 210 to be thick enough to deter the diffusion of dopants and other elements into the metal layer 205. For instance, it is advantageous for the conductive barrier layer 210 to have a thickness of between about 0.5 and about 10 nanometers and more preferably between about 2 and about 5 nanometers in order to allow polysilicon integration with subsequent contact silicidation and also to minimize gate stack formation difficulties due to the presence of a thick barrier layer during pattern and etch.

It is also preferable for the metal layer 205 to be substantially free of the same elements that comprise the conductive barrier layer 210. For the purposes of the present invention, the term substantially free is defined as less than about 1 atomic percent of the aforementioned elements.

For instance, it is advantageous for the metal element of the conductive barrier layer 210 to be different from that used in the metal layer 205. This facilitates the removal of unwanted portions of the conductive barrier by etching procedures, as discussed above, without removing the metal layer 205. For instance, when the metal layer 205 is made of tungsten, it is preferable but not required that tungsten is not the metal element of the conductive barrier layer 210. In such instances, therefore, a conductive barrier of tantalum nitride or titanium nitride is preferred over tungsten nitride.

In addition, it is preferable for the metal layer 205 to be substantially free of the anionic elements of the conductive barrier layer 210. This advantageously ensures that the work function of the metal layer 205 remains matched to the valence or conduction band of the substrate 105. As an example, it is preferable for the metal layer 205 to be substantially free of nitrogen, carbon or boron, when the conductive barrier layer 210 comprises a metal nitride, metal carbide or metal boride, respectively.

Figure 3:
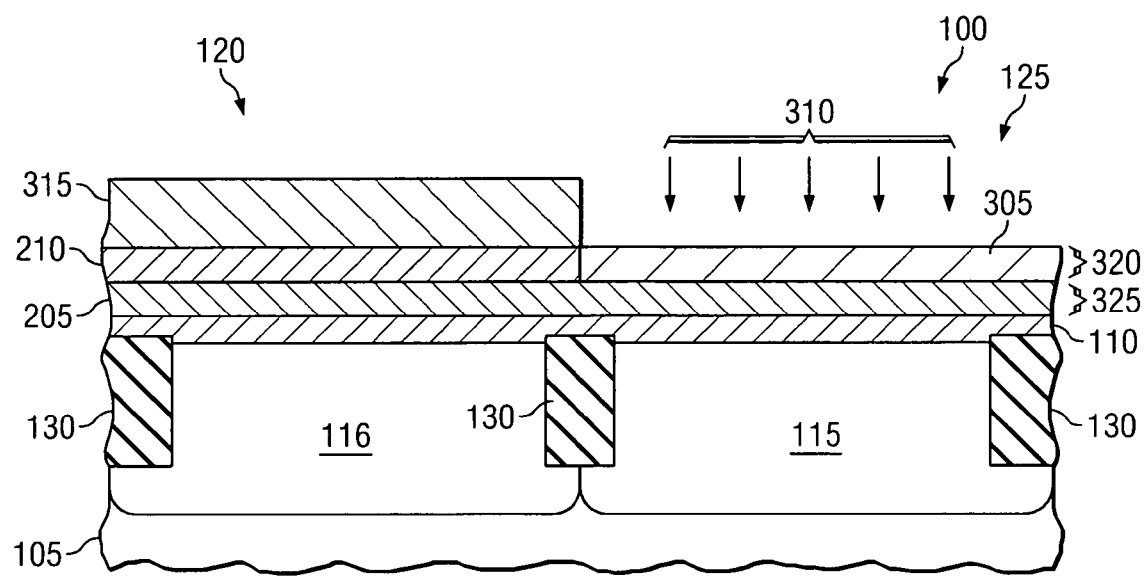

Referring now to FIG. 3, depicted is the partially completed device 100 after forming a material layer 305 over, and preferably on, the metal layer 205. As depicted in FIG. 3, the material layer is formed on the metal layer 205 that is not covered by the conductive barrier layer 210. In certain preferred embodiment material 305 is blanket deposited, and therefore is also on the conductive barrier layer 210. In some embodiments, the material layer on the conductive barrier layer could be removed using conventional patterning and etch processes. In other embodiments, however, the material layer on the conductive barrier layer is retained during subsequent processing steps.

The material layer 305 contains an element, preferably a non-refractory metal element, such as aluminum or silicon. The same conventional procedures, such as PVD, CVD, ALD, or other techniques, can be used to form the material layer 305 as used to form the gate dielectric layer 105 and metal layer 205. The selection of material to comprise the material layer 305 depends upon whether the metal alloy is to be matched the valence band or conduction band of the substrate 105. For instance, a material layer 305 of aluminum is preferred to match a silicon substrate's 105 valence band while a material layer 305 of silicon is preferred to match the silicon substrate's 105 conduction band. In embodiments where the material layer 305 is silicon, either polycrystalline silicon or amorphous silicon can be used. Additionally, silicon germanium can also be used for the material layer 305.

In some embodiments, as shown in FIG. 3, dopants 310 are also implanted into the material layer 305. Dopant implantation can facilitate matching of the work function of the metal alloy layer with the valence or conduction band of the substrate 105 as well as improve gate conductivity.

In instances where the dopants 310 could be inadvertently implanted into the gate dielectric layer 110 or semiconductor substrate 105, it can be advantageous for the dopants 310 to be co-deposited with the material layer 305, using conventional PVD or other procedures. Co-deposition also facilitates a homogenous distribution of dopants 310 in the material layer 305. In some cases, it is also advantageous to form a protective mask layer 315 over the conductive barrier layer 210 to deter dopant implantation into the metal layer 205, dielectric layer 110 or semiconductor substrate 105. The mask layer 315 can be made of a resist material, such as photoresist and appropriately patterned using conventional lithographic techniques.

To ensure that the metal layer 205 is fully alloyed with the material layer 305, it is desirable to maintain a ratio of thickness 320 of the material layer 305 to the thickness 325 of the metal layer 205 of at least about 2:1, more preferably at least about 2.5:1, and even more preferably greater than about 3:1.

As shown in FIG. 3, in some cases, the material layer 305 is deposited to a thickness 320 that just sufficient to attain the ratio needed for fully alloying the metal layer 205. As an example, when the metal layer 205 has a thickness 325 of about 5 nanometers, the material layer 305 preferably has a thickness of at least about 12.5 nanometers, and more preferably about 15 nanometers.

Figure 4:
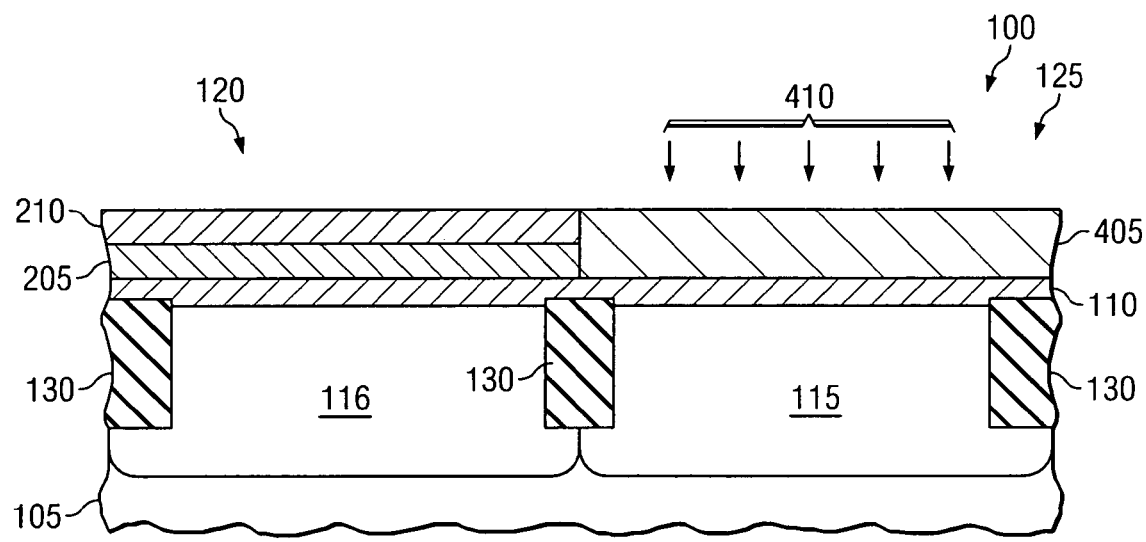

With continuing reference to FIG. 3, FIG. 4 depicts the partially completed device 100 after annealing the metal layer 205 and the material layer 305 to form a metal alloy layer 405. When the material later 305 comprises silicon or silicon germanium, the metal alloy layer 405 is a metal silicide or metal germanosilicide layer, respectively. In some advantageous embodiments, annealing includes heating the metal layer 205 and the material layer 305 to a temperature of between about 400° C. and 1400° C., for a period of least about 1 second. In the depicted embodiment, the material layer 305 on the metal layer 205 is substantially converted (e.g., at least about 99%) into the metal alloy layer 405 in the annealing step. Regardless of whether material layer 305 is fully converted into the metal alloy layer 405 during the anneal, it is preferred that the metal layer 205 is fully converted to the metal alloy layer 405 so that this layer 405 is in intimate contact with the gate dielectric layer 110 and sets the work function for the transistor 125.

The work function of the metal alloy layer 405 can be matched to another of the conduction band or the valence band of the semiconductor substrate 105. For instance, if the work function of the metal layer 205 is matched to the conduction band of the semiconductor substrate 105, then the work function of the metal alloy layer 405 is matched to the valence band of the substrate 105. Alternatively, if the work function of the metal layer 205 is matched to the valence band of the semiconductor substrate 105, then the work function of the metal alloy layer 405 is matched to the conduction band of the semiconductor substrate 105. In some embodiments, dopants 410 are implanted into the metal alloy layer 405 to further adjust the work function or increase the conductivity of the metal alloy layer 405, similar to that discussed above.

Figure 5:
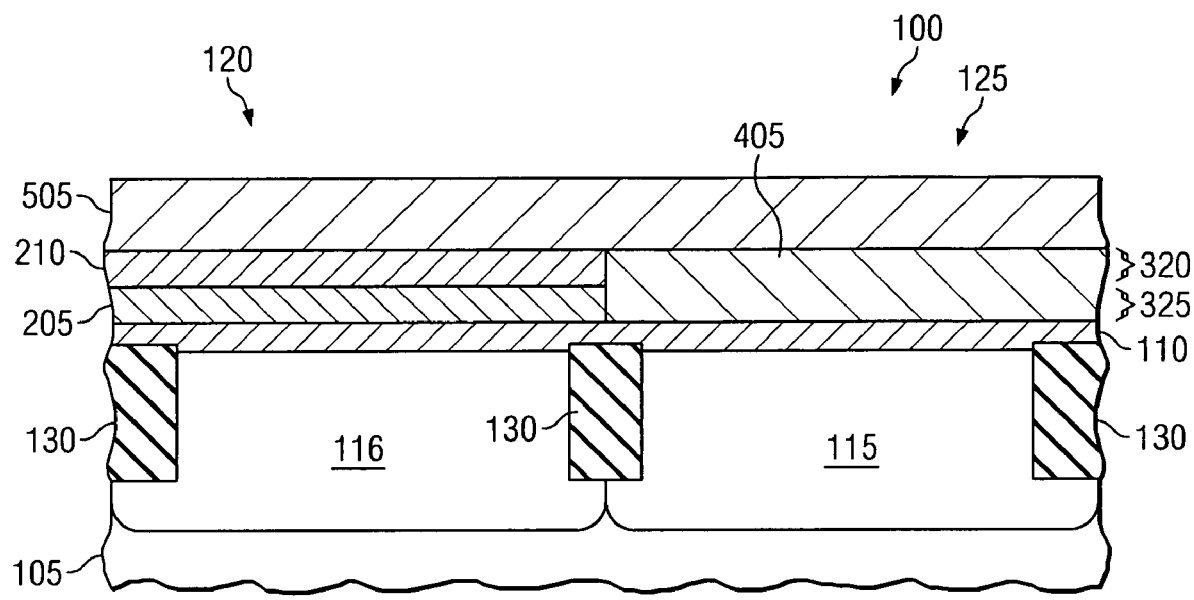

With continuing reference to FIGS. 3 and 4, FIG. 5 depicts the partially completed device 100 after forming a conductive layer 505 on the conductive barrier layer 210 and the metal alloy layer 405. In embodiments where the material layer 305 is retained on the conductive barrier layer 210 then the conductive layer 505 is formed on the material layer 305. Any of the above-described techniques used to form the gate dielectric layer 105, metal layer 205, etc . . . can be used to form the conductive layer 505. This embodiment is advantageous when one of more of the thicknesses of the metal layer 205, barrier layer 210 or metal alloy layer 405 are insufficient for a required gate height, or when one or more of these layers have insufficient conductivity. In certain preferred embodiments, the conductive layer 505 is polysilicon and can include dopants to increase the conductive layer's 505 conductivity.

Figure 6:
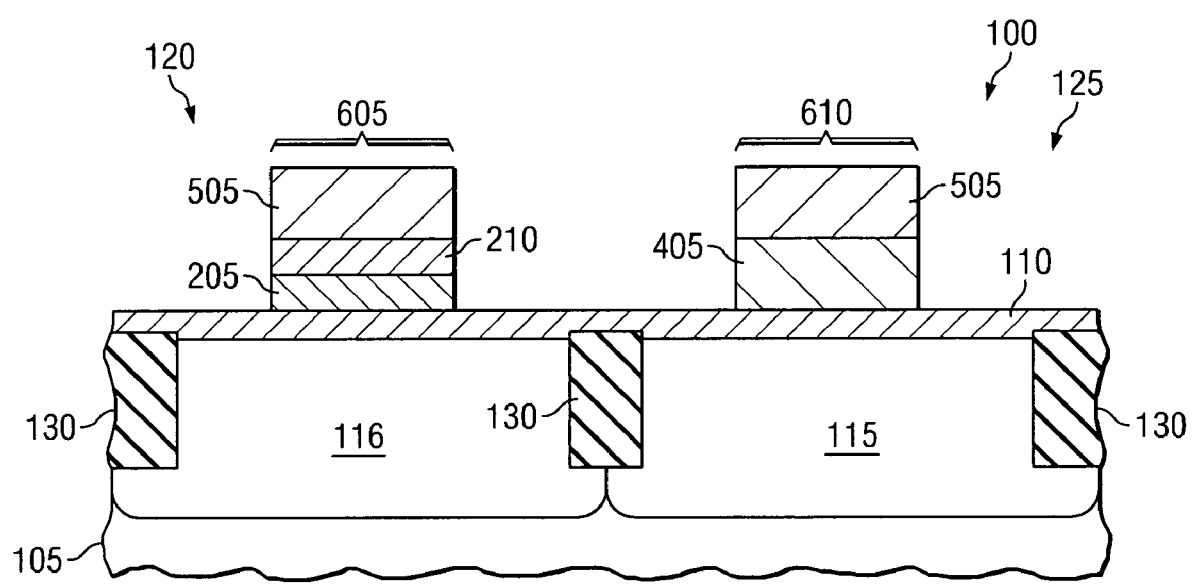

With continuing reference to FIG. 5, FIG. 6 depicts the partially completed device 100 after patterning the metal layer 205, conductive barrier layer 210, metal alloy layer 405 and optional conductive layer 505 to form a first and second gate structures 605, 610. As illustrated in FIG. 6, the first and second gate structures 605, 610 are located in the first and second transistor regions, 120, 125 respectively.

Figure 7:
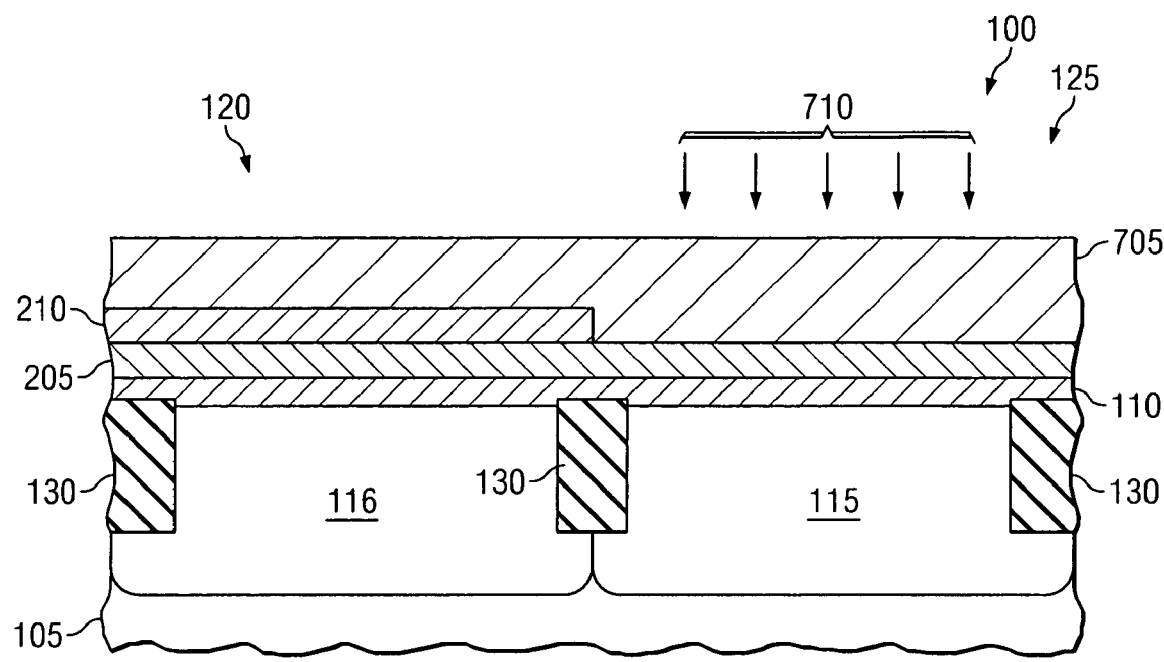

With continuing reference to FIGS. 1-6, FIGS. 7-8 illustrate an alternative processing scheme for forming the dual work function metal gate semiconductor device 100. Turning first to FIG. 7, as an alternative to forming the material layer 305 shown in FIG. 3, a thick material layer 705 is formed over, and preferably on, the metal layer 205. In some preferred embodiments, the thickness ratio of the material layer 705 to the metal layer 205 is greater than about 3:1, more preferably greater than about 5:1, and even more preferably between about 5:1 and about 10:1. The use of a thick material layer 705 advantageously provides greater control over the implantation of dopants 710 into the material layer 705, thereby avoiding implanting dopants into the underlying dielectric layer 110 and substrate 105.

With continuing reference to FIGS. 1-7, FIG. 8 illustrates the partially completed device after annealing to form the metal alloy layer 805. As illustrated, the material layer 705 is not entirely converted into a metal alloy 805 by the above-described annealing process. The remaining non-alloyed material layer 705 can serve the same function as, and thus obviate need to form the conductive layer 505 illustrated in FIG. 5, thereby simplifying the processing scheme.

Of course, the metal layer 205, conductive barrier layer 210, metal alloy layer 805 and material layer 705 can be patterned to form first and second gate structures, analogous to that depicted in FIG. 6. Additionally, various additional conventional steps, well known to those skilled in the art, can be performed to complete the fabrication of the partially completed device 100 shown in FIG. 6 to form an active device.

Figure 9:
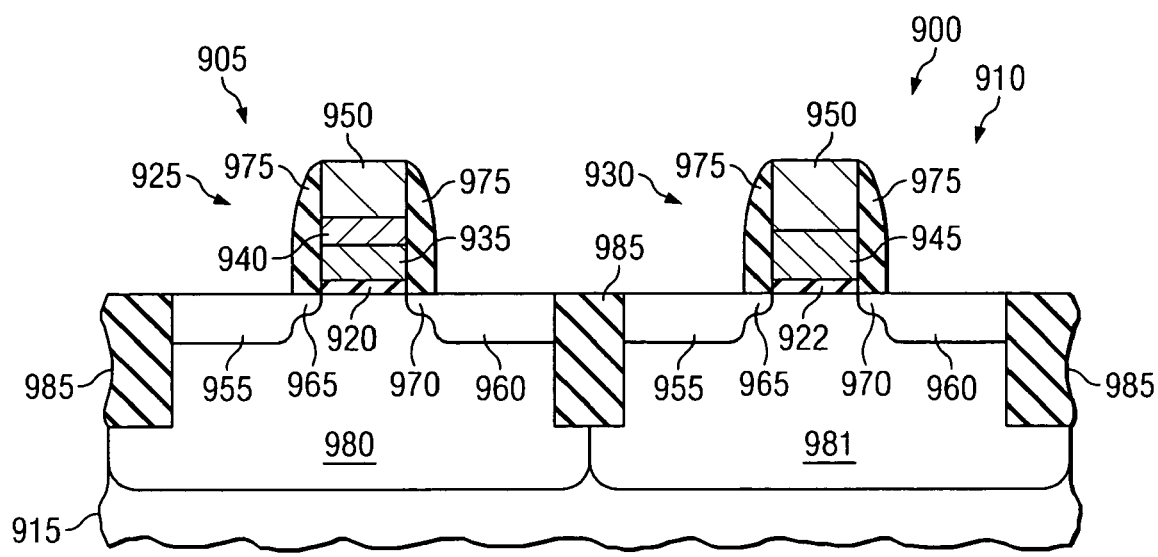
FIG. 9 illustrates a sectional view of an exemplary dual work function metal gate semiconductor device manufactured according to the principles of the present invention.

Another embodiment of the present invention, presented in FIG. 9, is a dual work function metal gate semiconductor device 900. In one preferred embodiment, the device 900 is a CMOS device having first and second transistors, 905, 910 comprising pMOS and nMOS transistors, respectively. Any of the above-described processes and materials can be used to fabricate the device 900. Conversely, any of the embodiments of the device 900 described below can be made according to the above-described processes.

The device 900 includes a semiconductor substrate 915 and a gate dielectric 920, 922 over, and preferably on, the substrate 915. As noted above, the substrate 915 has a conduction band and a valence band. The device 900 further includes a first and a second gate 925, 930 located over the gate dielectric 920, 922. For an efficient fabrication process, the gate dielectric 920, 922 under the first and second gate 925, 930 are preferably formed from the same material. However, alternative embodiments where the gate dielectric layer 920, 922, under the first and second gate 925, 930, are composed of different materials are also within the scope of the present invention.

The first gate 925 comprises a metal layer 935 located over, and preferably on, the gate dielectric 920, and a conductive barrier layer 940 located over and preferably on, the metal layer 935. The metal layer 935 has a work function matched to the conduction band or the valence band of the substrate 915. The second gate 930 includes a metal alloy layer 945 having a same metal element as the metal layer 935. The metal alloy layer 945 has a work function matched to another of the conduction band or the valence band of the substrate 915.

Figure 8:
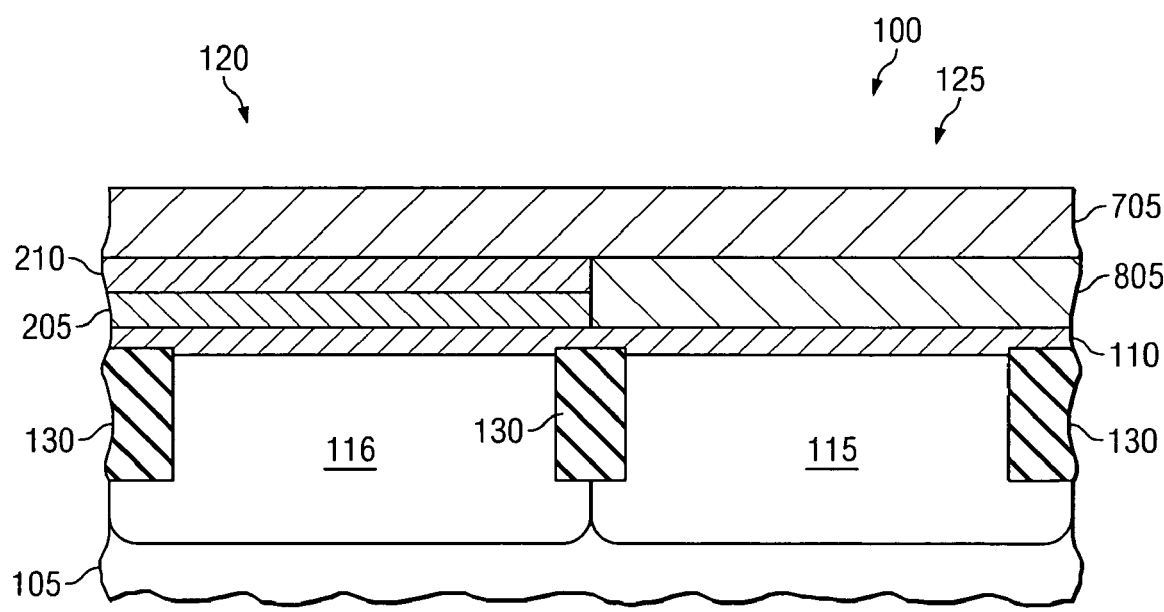

As further illustrated in FIG. 9, the device 900 can also include a conductive layer 950 over, and preferably on, the conductive barrier layer 940 and the metal alloy layer 945. In embodiments where the device 900 is fabricated according to the scheme shown in FIGS. 3-5 where the material layer 305 is fully alloyed to the metal layer 205, the conductive layer 950 is a preferably a separately deposited silicon layer. In alternative embodiments, where device fabrication involves forming a thick material layer 705 such as shown in FIGS. 7-8, the conductive layer 950 is that portion of the material layer that is not alloyed to the metal layer. In certain preferred embodiments the conductive layer 950 include p-type dopants such as boron, while in other preferred embodiments the conductive layer 950 includes n-type dopants such as phosphorus, arsenic or antimony.

In some embodiments, the first gate 925 is located in a nMOS transistor 905 and the second gate 930 is an pMOS transistor 910. In cases where the semiconductor substrate 915 comprises silicon, the metal layer 935 preferably has a work function of less than about 4.4 eV and is matched to the conduction band of the substrate 915. Suitable materials to achieve the desired work function include tantalum, titanium, hafnium, zirconium or mixtures thereof. The conductive barrier layer 940 preferably comprises a metal element that is different from the metal layer 935 and includes anionic components such as nitrogen, carbon or boron. As an example, when the metal layer 935 comprises hafnium, the conductive barrier layer 940 is preferably a tantalum nitride, titanium nitride, or zirconium nitride. However, the conductive barrier layer 940 could comprise any combination of tantalum, titanium, hafnium, zirconium, tungsten or molybdenum with a nitrogen, carbon or boron.

In such embodiments, the metal alloy layer 945 preferably has a work function of greater than about 4.8 eV and is matched to the valence band of the substrate 915. Preferably, the metal alloy layer 945 comprises the same metal element as in the metal layer 935 and the metal is alloyed to aluminum. Continuing with the same example of the metal layer 935 being composed of hafnium, the metal alloy layer 945 is then preferably a hafnium-aluminum alloy. In certain embodiments, the metal alloy layer 945 can further include n-type or p-type dopants to further adjust its work function. For example, including p-type dopants facilitates matching of the Fermi level of the metal alloy layer 945 to the semiconductor substrate's 915 valence band.

In other embodiments, the first gate 925 is located in a pMOS transistor 905 and the second gate 930 is an nMOS transistor 910. In some cases the metal layer 935 has a work function of greater than about 4.8 eV and is matched to the valence band of the silicon substrate 915. Suitable materials to achieve the desired work function include molybdenum, tungsten or mixtures thereof. As noted above, the conductive barrier layer 940 preferably has a metal element that is different from the metal layer 935. For instance, when the metal layer 935 is made of tungsten the conductive barrier layer 940 is preferably a tantalum nitride, titanium nitride, or zirconium nitride, although combinations of tantalum, titanium, hafnium, zirconium, tungsten and molybdenum with nitrogen, carbon or boron are also within the scope of the present invention.

In these embodiments, the metal alloy layer 945 preferably has a work function of less than about 4.4 eV and is matched to the conduction band of the silicon substrate 915. Preferably, the metal alloy layer 945 comprises the same metal element as in the metal layer 935 and the metal is alloyed to silicon. Continuing with the same example of when the metal layer 935 is composed of tungsten, the metal alloy layer 945 is then preferably tungsten silicide, and more preferably has as Si:W ratio of at least about 2:1. As in the previous example, the metal alloy layer 945 can include n-type or p-type dopants to further adjust its work function. For example, n-type dopants, such as arsenic, antimony or phosphorus, help match the Fermi level of the metal alloy layer 945 to the semiconductor substrate's 915 conduction band.

One skilled in the art would understand that various other conventional components can be added to make the device 900 operative, including source and drain structures 955, 960, source and drain extensions 965, 970, gate sidewalls 975, wells 980, 981 and isolation structures 985.

Figure 10:
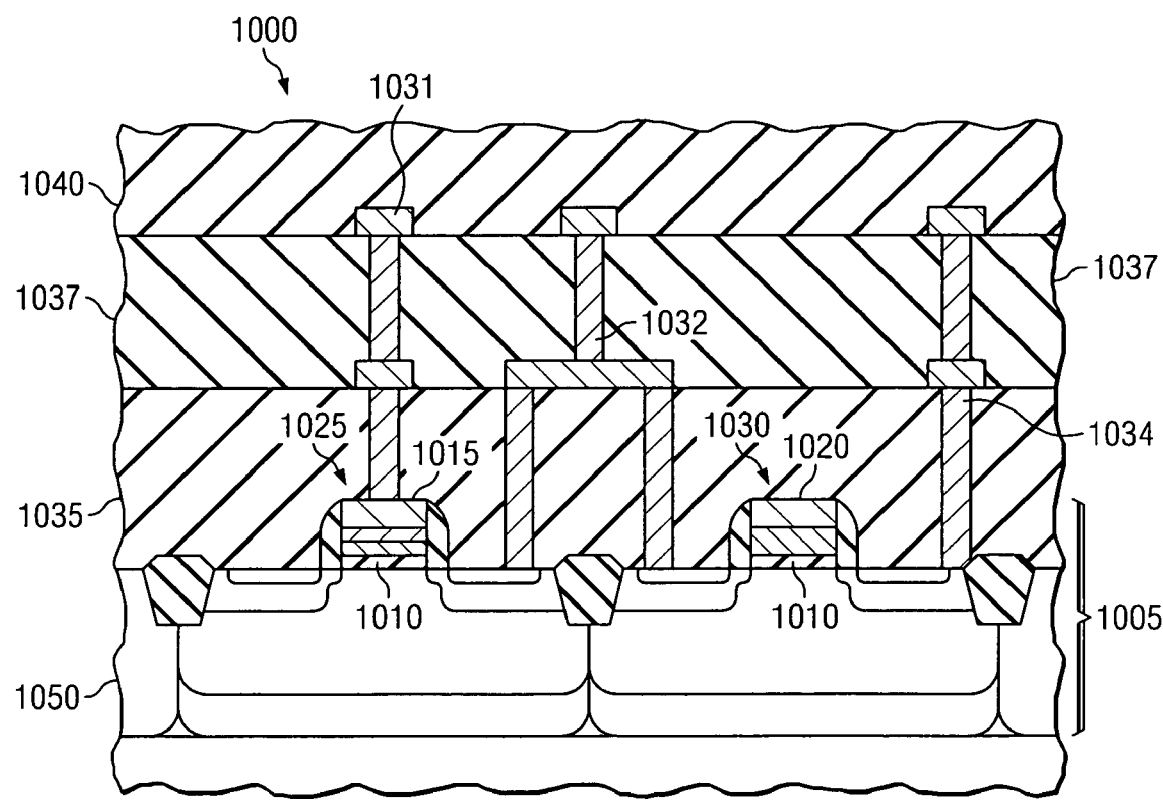
FIG. 10 illustrates a sectional view of an exemplary integrated circuit manufactured according to the principles of the present invention.

FIG. 10 presents a cross-sectional view of yet another embodiment of the present invention, an integrated circuit 1000. The integrated circuit 1000 depicted in FIG. 10, includes a dual work function metal gate semiconductor device 1005. The device 1005 comprises a gate dielectric layer 1110 and first and second gates 1015, 1020 located over the gate dielectric. In certain preferred embodiments, the first and second gates 1015, 1020 are in first and second active devices, 1025, 1030, respectively. In some instances, the first and second active devices 1025, 1030 correspond to nMOS and pMOS transistors, respectively, that work in cooperation to form a device 1005 that is a CMOS device. The integrated circuit 1000 also includes interconnect metals lines 1031, 1032, 1034 on one of more insulating layers 1035, 1037, 1040 located over the first and second gates 1015, 1020 and interconnecting the gates 1015, 1020 to form an operative integrated circuit 1000.

The first and second gates 1015, 1020, and other device components, can be formed according to any of the embodiments described above and shown FIGS. 1-9. The work function of the first gate 1015 is matched to the conduction band or valence band of the substrate 1050, while the work function of the second gate 1020 is matched to the other of the conduction band or valence band of the substrate 1050.

Although the present invention has been described in detail, one of ordinary skill in the art should understand that they can make various changes, substitutions and alterations herein without departing from the scope of the invention.

What is claimed is:

1. A process for forming a dual work function metal gate semiconductor device, comprising:
    providing a semiconductor substrate having a gate dielectric layer thereon and a metal layer on said gate dielectric layer, a work function of said metal layer matched to a conduction band or a valence band of said semiconductor substrate;
    forming an electrically conductive barrier layer on a portion of said metal layer;
    forming a material layer on said metal layer wherein forming said material layer includes co-depositing silicon or aluminum and n-type or p-type dopants; and
    annealing said metal layer and said material layer to form a metal alloy layer, the metal alloy layer comprising the co-deposited dopants, to thereby match a work function of said metal alloy layer to another of said conduction band or said valence band.

2. The process recited in claim 1, wherein said metal alloy layer has a same metal element as said metal layer.

3. The process recited in claim 1, wherein said conductive barrier layer is a metal nitride, metal carbide or metal boride.

4. The process recited in claim 1, wherein a metal element of said conductive barrier layer is different from said metal layer.

5. The process recited in claim 1, wherein said material layer comprises aluminum.

6. The process recited in claim 1, further including implanting n-type or p-type dopants in said metal alloy layer.

7. The process recited in claim 1, wherein said material layer and said metal layer have a thickness ratio of at least about 2.5:1.

8. The process recited in claim 1, wherein said conductive barrier layer has a thickness of between about 0.5 and about 10 nanometers.

9. The process recited in claim 1, further including forming a conductive layer on said metal alloy layer and said conductive barrier layer.

10. The process recited in claim 9, wherein said conductive layer comprises silicon and forming said conductive layer further includes implanting n-type or p-type dopants in said silicon layer.

11. The process recited in claim 1, wherein said conductive barrier layer comprises an anionic element and said metal layer is substantially free of said anionic element.

12. The process recited in claim 1, wherein said metal layer is substantially free of a metal element and an anionic element of said conductive barrier layer.

13. The process recited in claim 1, wherein said metal layer is substantially free of nitrogen, carbon and boron.

14. A method of manufacturing an integrated circuit, comprising:
- forming a dielectric layer over a semiconductor substrate that has first and second complementary wells formed therein;
- forming a metal layer on said gate dielectric layer over said first and second complementary wells, said metal layer having a work function that is matched to one of a conduction band or to a valence band of one of said first or second complementary wells;
- forming a barrier layer comprising a metal on a portion of said metal layer located over either said first or second complementary wells, wherein said metal of said barrier layer is different from said metal layer;
- forming a material layer on said metal layer wherein forming said material layer includes co-depositing silicon or aluminum and n-type or p-type dopants;
- annealing said metal layer and said material layer to form a metal alloy layer, the metal alloy layer comprising the co-deposited dopants, to thereby match a work function of said metal alloy layer to another of said conduction band or said valence band;
- patterning said metal layer and said barrier layer to form a first gate electrode over said first complementary well and
- patterning said metal alloy layer to form a second gate electrode over said second complementary well.

15. A process for forming a dual work function metal gate semiconductor device, comprising:
- providing a semiconductor substrate having a gate dielectric layer thereon and a metal layer on said gate dielectric layer, a work function of said metal layer matched to a conduction band or a valence band of said semiconductor substrate;
- forming an electrically conductive barrier layer on a portion of said metal layer, wherein said conductive barrier layer is a metal carbide or metal boride;
- forming a material layer on said metal layer wherein forming said material layer includes co-depositing silicon or aluminum and n-type or p-type dopants; and
- annealing said metal layer and said material layer to form a metal alloy layer, the metal alloy layer comprising the co-deposited dopants, to thereby match a work function of said metal alloy layer to another of said conduction band or said valence band.

* * * * *